(12) United States Patent
Fujita et al.

(10) Patent No.: US 8,462,599 B2
(45) Date of Patent: Jun. 11, 2013

(54) OPTICAL OSCILLATION DEVICE AND RECORDING APPARATUS

(75) Inventors: Goro Fujita, Kanagawa (JP); Tsutomu Maruyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/540,858

(22) Filed: Jul. 3, 2012

(65) Prior Publication Data
US 2013/0021887 A1 Jan. 24, 2013

(30) Foreign Application Priority Data

Jul. 19, 2011 (JP) ................. 2011-158323

(51) Int. Cl.
*G11B 5/09* (2006.01)
(52) U.S. Cl.
USPC ...................................... 369/47.25
(58) Field of Classification Search
USPC ... 369/47.25; 372/29.011, 38.01, 50.1–50.23, 372/29.01–29.016
See application file for complete search history.

(56) References Cited

U.S. PATENT DOCUMENTS

2007/0147450 A1* 6/2007 Inoue et al. ................. 372/38.02
2011/0234744 A1* 9/2011 Fujita et al. .................. 347/248

OTHER PUBLICATIONS

Watanabe, et al., "10-W Peak-Power Picosecond Optical Pulse Generation from a Triple Section Blue-Violet Self-Pulsating Laser Diode," The Japan Society of Applied Physics, Applied Physics Express vol. 3, Received Feb. 18, 2010; accepted Mar. 30, 2010; published online Apr. 16, 2010. (3 pages).

* cited by examiner

*Primary Examiner* — Wayne Young
*Assistant Examiner* — Brenda Bernardi
(74) *Attorney, Agent, or Firm* — K&L Gates LLP

(57) ABSTRACT

Provided is a recording apparatus including a self-excited oscillation semiconductor laser that has a double quantum well separate confinement heterostructure and includes a saturable absorber section to which a negative bias voltage is applied and a gain section into which a gain current is injected, an optical separation unit, an objective lens, a light reception element, a pulse detection unit, a reference signal generation unit, a phase comparison unit, a recording signal generation unit, and a control unit.

4 Claims, 9 Drawing Sheets

OPTICAL OSCILLATION DEVICE AND RECORDING APPARATUS

CROSS REFERENCES TO RELATED APPLICATIONS

The present application claims priority to Japanese Priority Patent Application JP 2011-158323 filed in the Japan Patent Office on Jul. 19, 2011, the entire content of which is hereby incorporated by reference.

BACKGROUND

The present application relates to an optical oscillation device emitting laser light and a recording apparatus using the optical oscillation device.

In recent years, larger capacity and higher speed of communication have been necessary with the development of IT in society. Therefore, with regard to media used to propagate information, optical communication technologies using not only radio waves with frequencies of, for example, a 2.4 GHz band and a 5 GHz band, as in radio communication, but also light with a wavelength of, for example, a 1.5 μm band (up to hundreds of THz in frequency) have rapidly come into wide use.

For example, a method of transmitting information by light is used not only for optical communication such as optical fiber communication but also for recording and reproducing information on and from recording media. Therefore, optical information technologies will become an important basis for supporting the development of the future information society.

When information is transmitted or recorded by light, a light source that oscillates specific pulses is necessary. In particular, high-output and short-pulsed light sources are indispensable in communication and for large capacity and high speed of recorded and reproduced information, and thus various semiconductor lasers have been studied and developed as the light sources that satisfy the large capacity and high speed of the information.

For example, when reproduction from an optical disc is performed using a single-mode laser, noise may occur due to interference of an optical system and an oscillation wavelength may also be changed due to a change in temperature, and therefore output variation or noise may occur.

Accordingly, a high-frequency superimposing circuit performs a modulation process of changing the mode of a laser to a multi-mode from the outside to suppress an output variation caused due to a change in temperature or due to light returned from an optical disc. However, this method may lead to an increase in the size of an apparatus in proportion to addition of the high-frequency superimposing circuit, and thus may lead to an increase in cost.

In a self-excited oscillation semiconductor laser, however, the output variation can be suppressed even without using the high-frequency superimposing circuit, since multi-mode oscillation can be directly realized by blinking a light source at a high frequency.

For example, a light source capable of achieving an oscillation output of 10 W and a pulse width of 15 psec at a frequency of 1 GHz has been realized using a self-excited oscillation GaN violet-blue semiconductor laser (for example, see Applied Physics Express 3, (2010) 052701 by Hideki Watanabe, Takao Miyajima, Masaru Kuramoto, Masao Ikeda, and Hiroyuki Yokoyama).

This semiconlductor laser is a tri-sectional self-excited oscillation semiconductor aser that includes a saturable absorber section and two gain sections between which the saturable absorber section is interposed.

This semiconductor laser applies a reverse bias voltage to the saturable absorber section. At this time, laser light with a wavelength of, for example, 407 nm is emitted by injecting a current into the two gain sections.

SUMMARY

The light source that achieves the high output and the short pulse width is expected to be applied to, for example, a recording light source for a two-photon absorption recording medium or various fields such as non-linear optical biological body imaging or micromachining.

In recent years, optical circuits in which silicon electronic devices are connected to one another by an optical wiring and signal transmission is performed by light to realize high-speed signal transmission have been suggested. In the future, to enable the optical circuit to perform a calculating process, an optical oscillator that generates a master clock of the electronic circuit is necessary.

When a self-excited oscillation type laser is used as the optical oscillator, a specific frequency should be prepared according to a use.

It is necessary for a recording and reproducing apparatus to output a Worb signal read from an optical recording medium or a recording signal synchronized with a rotation synchronization signal from a spindle motor that rotates an optical recording medium from a light source.

However, a specific pulsed light frequency may be generally determined as the frequency of the self-excited oscillation type laser depending on the configuration of the self-excited oscillation type laser. For this reason, it is necessary to manufacture the laser according to a use and it necessary to realize considerably high manufacturing accuracy. Therefore, the manufacturing cost may increase.

In light of the foregoing, it is desirable to provide an optical oscillation device and a recording apparatus capable of easily obtaining a desired frequency of pulsed light with a simple configuration.

According to an embodiment of the present application, there is provided an optical oscillation device including a self-excited oscillation semiconductor laser that has a double quantum well separate confinement heterostructure and includes a saturable absorber section to which a negative bias voltage is applied and a gain section into which a gain current is injected. The optical oscillation device further includes an optical separation unit that separates an oscillated light beam from the self-excited oscillation semiconductor laser into two oscillated light beams and an objective lens that collects one of the separated oscillated light beams on an optical recording medium. The optical oscillation device further includes a light reception element that receives the one of the oscillated light beams separated by an optical separation unit; and a pulse detection unit that detects a pulse of the oscillated light beam received by the light reception element. The optical oscillation device further includes a reference signal generation unit that generates a master clock signal; and a phase comparison unit that calculates a phase difference between the master clock signal and the pulse.

The optical oscillation device according to the embodiment of the present application further includes a recording signal generation unit that generates a recording signal using a negative voltage at a timing of the master clock signal. The optical oscillation device further includes a control unit that controls the negative bias voltage to be applied to the saturable absorber section based on the recording signal and that outputs a direct current voltage during a non-oscillation period of the self-excited oscillation semiconductor laser and outputs a desired period voltage during an oscillation period of the self-excited oscillation semiconductor laser. Here, the period voltage is defined as a voltage that changes at a desired period.

According to another embodiment of the present application, there is provided a recording apparatus including a recording signal generation unit that generates a recording signal instead of the above-described signal generation unit of the optical oscillation device and an objective lens that condenses one of the oscillated light beams separated by the above-described optical separation unit on the optical recording medium.

In the optical oscillation device and the recording apparatus according to the embodiments of the present application, the oscillation frequency of the oscillated light beam can be controlled by controlling the period voltage to be applied to the saturable absorber section of the self-excited oscillation semiconductor laser.

Accordingly, the self-excited oscillation semiconductor laser can easily emit light at any oscillation frequency.

In the optical oscillation device and the recording apparatus according to the embodiments of the present application, the oscillated light beam of any oscillation frequency can be easily obtained.

Additional features and advantages are described herein, and will be apparent from the following Detailed Description and the figures.

DETAILED DESCRIPTION

Hereinafter, an example of a recording apparatus according to an embodiment of the present application and an example of a self-excited oscillation semiconductor laser used in the recording apparatus will be described with reference to the drawings. Embodiments of the present application will be described in the following order. The present application is not limited to the examples described below.
1. Configuration of Self-excited Oscillation Semiconductor Laser
2. Configuration of Recording Apparatus
    1. Configuration of Self-excited Oscillation Semiconductor Laser First, the configuration of a self-excited oscillation semiconductor laser 1 according to an embodiment of the present application will be described.

Figure 1:
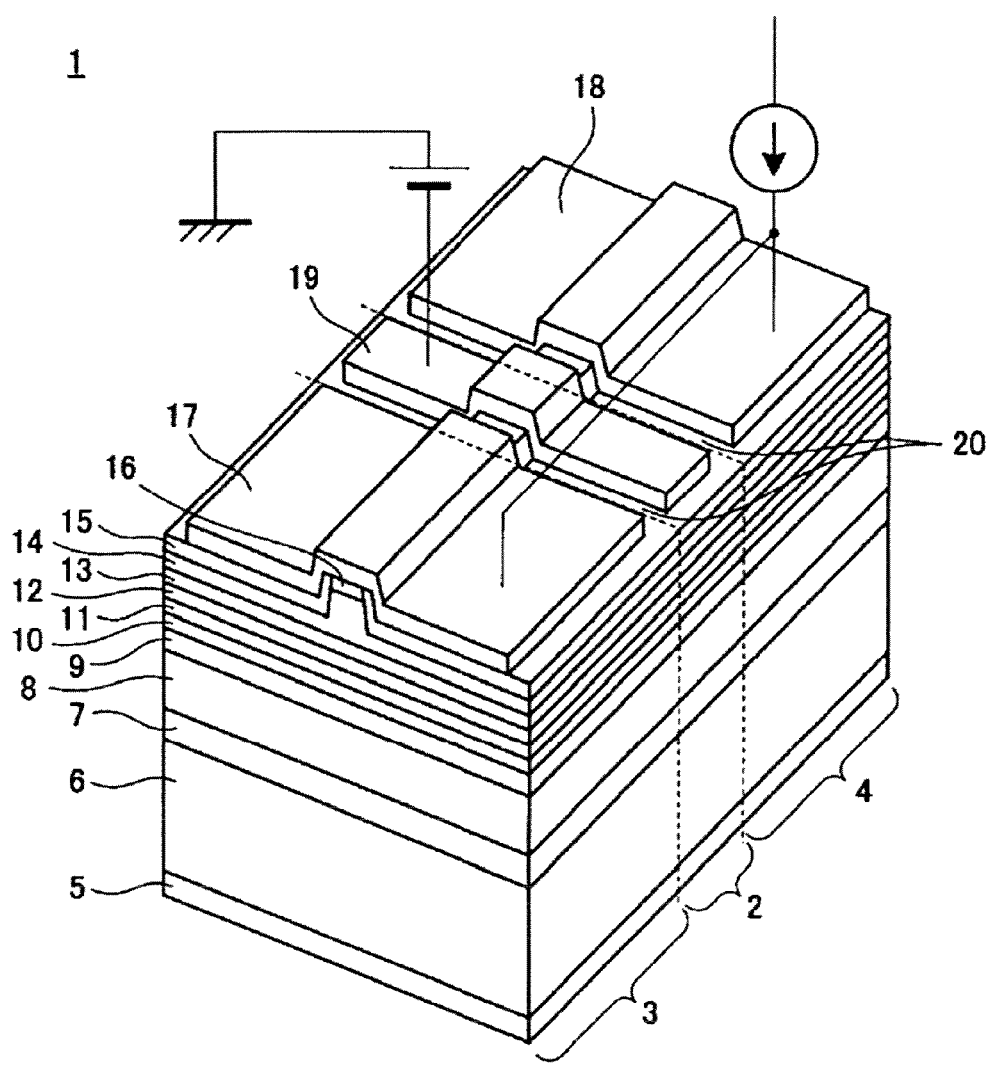
FIG. 1 is a schematic diagram illustrating the configuration of a self-excited oscillation semiconductor laser.

FIG. 1 is a schematic diagram illustrating the configuration of the self-excited oscillation semiconductor laser 1 according to the embodiment of the present application. The self-excited oscillation semiconductor laser 1 is a self-excited oscillation semiconductor laser disclosed in Applied Physics Express 3, (2010) 052701 by Hideki Watanabe, Takao Miyajima, Masaru Kuramoto, Masao Ikeda, and Hiroyuki Yokoyama.

The self-excited oscillation semiconductor laser 1 is a tri-sectional type self-excited oscillation semiconductor laser that includes a saturable absorber section 2, a first gain section 3, and a second gain section 4.

As shown in FIG. 1, the saturable absorber section 2 is interposed between the first gain section 3 and the second gain section 4.

When the saturable absorber section 2 is provided, the absorptance of an absorber decreases with an increase in the intensity of light incident on the absorber. Therefore, since only a pulse with a high intensity penetrates the absorber, a narrower pulse can be obtained.

Further, a gain current is injected into the first gain section 3 and the second gain section 4.

A double quantum well separate confinement heterostructure formed of GaInN/GaN/AlGaN materials is formed on a (0001) surface of an n-type GaN substrate 6 (0001).

That is, an n-type GaN layer 7, an n-type AlGaN clad layer 8, an n-type GaN guide layer 9, and a double quantum well active layer 10 are sequentially laminated from the lower side on the n-type GaN substrate 6. Further, a GaInN guide layer 11, a p-type AlGaN layer 12, a p-type AlGaN barrier layer 13, and a p-type AlGaN/GaN superlattice first-clad layer 14 are sequentially laminated from the lower side on the double quantum well active layer 10.

The double quantum well separate confinement heterostructure can be formed by, for example, a metal organic chemical vapor deposition (MOCVD) method.

As shown in FIG. 1, a ridge structure is formed in the central portion of the p-type AlGaN/GaN superlattice first-clad layer 14, and a p-type GaN contact layer 16 is formed on the upper surface of the ridge structure. Further, a $SiO_2$/Si insulating layer 15 is formed on the side surface of the ridge structure or a portion of the p-type AlGaN/GaN superlattice first-clad layer 14 in which the ridge structure is not formed.

A first main electrode 17, a second main electrode 18, and a sub-electrode 19, which are p-type electrodes, are formed on a p-type GaN contact layer 16 and a $SiO_2$/Si insulating layer 15 by ohmic contact.

Specifically, the first main electrode 17 is formed on the first gain section 3 and the sub-electrode 19 is formed on the saturable absorber section 2. Further, the second main electrode 18 is formed on the second gain section 4. These electrodes are electrically isolated from each other by groove-shaped isolation portions 20.

An n-type lower electrode 5 is formed on a surface of the n-type GaN substrate 6 opposite to the n-type GaN layer 7 by ohmic contact.

In the self-excited oscillation semiconductor laser 1, as shown in FIG. 1, the sub-electrode 19 applies a negative bias voltage (hereinafter referred to as a reverse bias voltage) to the saturable absorber section 2. At this time, when a current (gain current) is injected into the first gain section 3 and the second gain section 4 from the first main electrode 17 and the second main electrode 18, respectively, laser light is emitted.

The proposers of the present application have found that an oscillated light beam can be modulated by changing the above-described reverse bias voltage and the oscillation frequency can be controlled by changing the value and the period of the reverse bias voltage during the oscillation period of the self-excited oscillation semiconductor laser 1. Further, the proposers of the present application have found that the oscillation frequency within the oscillation period can be controlled for each pulse by changing a value of the gain current.

That is, in the embodiment of the present application, the modulation of the oscillated light beam and the control of the oscillation frequency are performed by controlling the reverse bias voltage. Further, an interval of the pulsed light oscillated within the oscillation period is adjusted by changing the value of the gain current.

Hereinafter, an experiment result of the examined characteristics of the self-excited oscillation semiconductor laser 1 according to the embodiment of the present application will be described.

Figure 2:
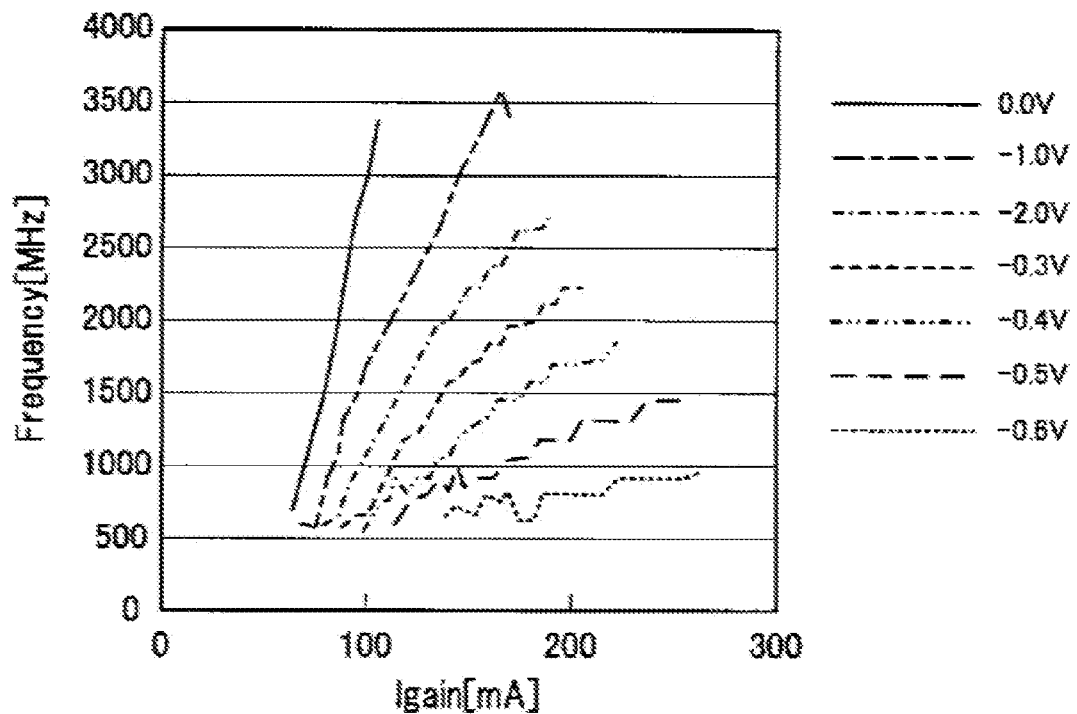
FIG. 2 is a diagram illustrating a relation between a gain current injected into the self-excited oscillation semiconductor laser and an oscillation frequency of an oscillated light beam emitted from the self-excited oscillation semiconductor laser.

FIG. 2 shows a measurement result of the oscillation frequency of the oscillated light beam when the reverse bias voltage (direct current voltage) at the oscillation time is made to be constant and the gain current is changed in the self-excited oscillation semiconductor laser 1 according to the embodiment of the present application. In FIG. 2, the horizontal axis represents a gain current (Igain) and the vertical axis represents an oscillation frequency. Here, a change in the oscillation frequency at each voltage value is examined while changing the reverse bias voltage (Vsa) at intervals of 1.0 V from 0 V to −6.0 V.

As shown in FIG. 2, it can be understood that the oscillation frequency of the oscillated light beam emitted from the self-excited oscillation semiconductor laser 1 increases when the reverse bias voltage (Vsa) is constant and the gain current (Igain) increases. Accordingly, the oscillation frequency can be controlled by changing the value of the gain current (direct current) in the oscillation of the self-excited oscillation semiconductor laser 1.

Figure 3:
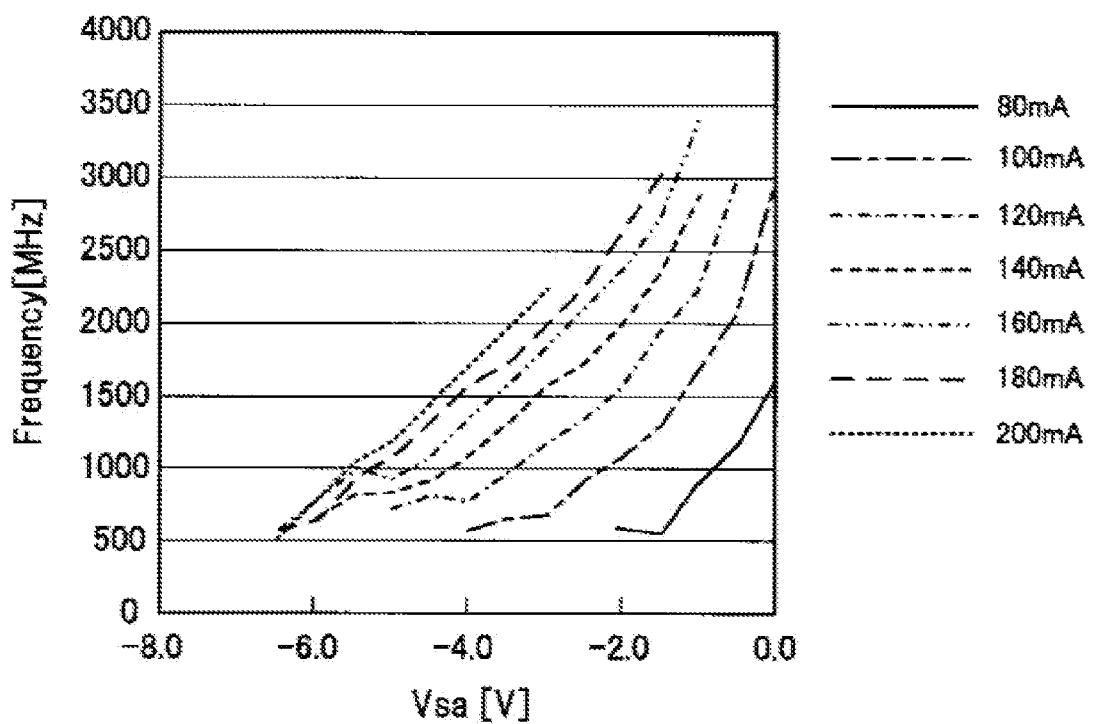
FIG. 3 is a diagram illustrating a relation between a reverse bias voltage applied to the self-excited oscillation semiconductor laser and the oscillated frequency of the oscillated light beam emitted from the self-excited oscillation semiconductor laser.

In FIG. 3, a change in the oscillation frequency is examined with respect to the change in the reverse bias voltage (direct current voltage in the oscillation) in the oscillation of the self-excited oscillation semiconductor laser 1 when the gain current (direct current) is constant. In FIG. 3, the horizontal axis represents the reverse bias voltage (Vsa) and the vertical axis represents the oscillation frequency. Further, the change in the oscillation frequency at each current value is examined while changing the gain current at intervals of 20 mA from 80 mA to 200 mA.

As shown in FIG. 3, it can be understood that the oscillation frequency of the oscillated light beam emitted from the self-excited oscillation semiconductor laser 1 decreases when the gain current (Igain) is constant and the reverse bias voltage (Vsa) increases in the negative direction. That is, the oscillation frequency can be controlled by changing the value of the reverse bias voltage (direct current voltage) in the oscillation (during the oscillation period) of the self-excited oscillation semiconductor laser 1.

Figure 4:
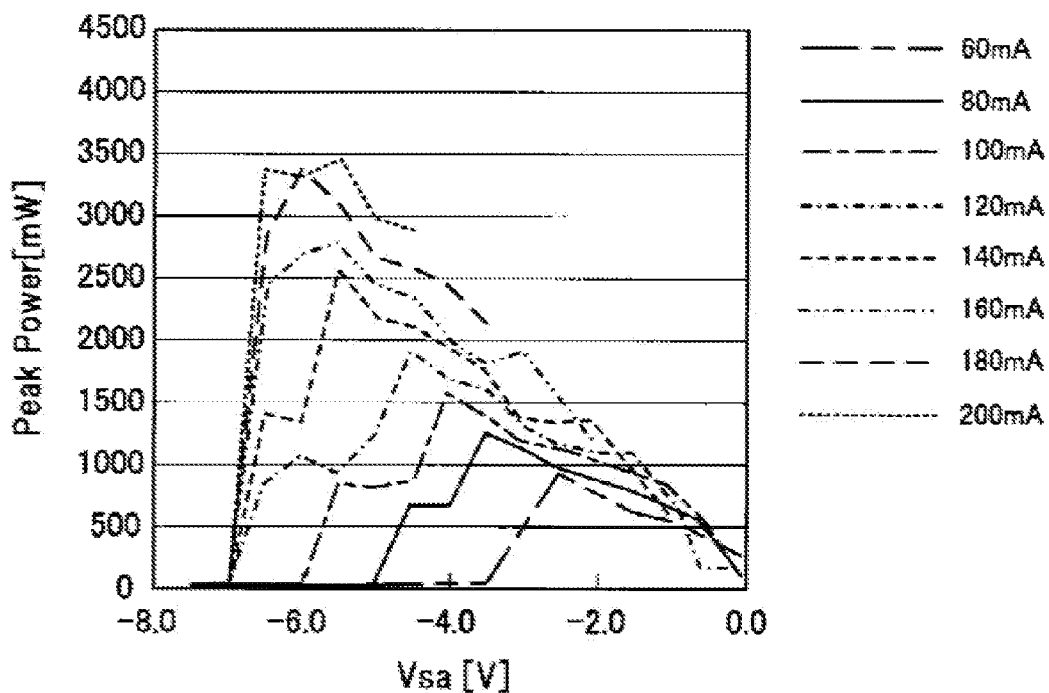
FIG. 4 is a diagram illustrating a relation between the reverse bias voltage applied to the self-excited oscillation semiconductor laser and a peak power of the oscillated light beam emitted from the self-excited oscillation semiconductor laser.

FIG. 4 is a diagram illustrating a relation between the reverse bias voltage (Vsa) applied to the self-excited oscillation semiconductor laser 1 and a peak power of the oscillated light beam emitted from the self-excited oscillation semiconductor laser 1. In FIG. 4, the horizontal axis represents the reverse bias voltage (Vsa) and the vertical axis represents the peak power.

As understood from FIG. 4, the peak power increases when the reverse bias voltage (Vsa) increases in the negative direction from zero. Further, when the reverse bias voltage (Vsa) is greater than a predetermined voltage in the negative direction, the peak power decreases and the oscillation finally stops. Thus, since the value of the peak power is changed by the reverse bias voltage (Vsa), the peak power can be controlled using the reverse bias voltage (Vsa).

Figure 5:
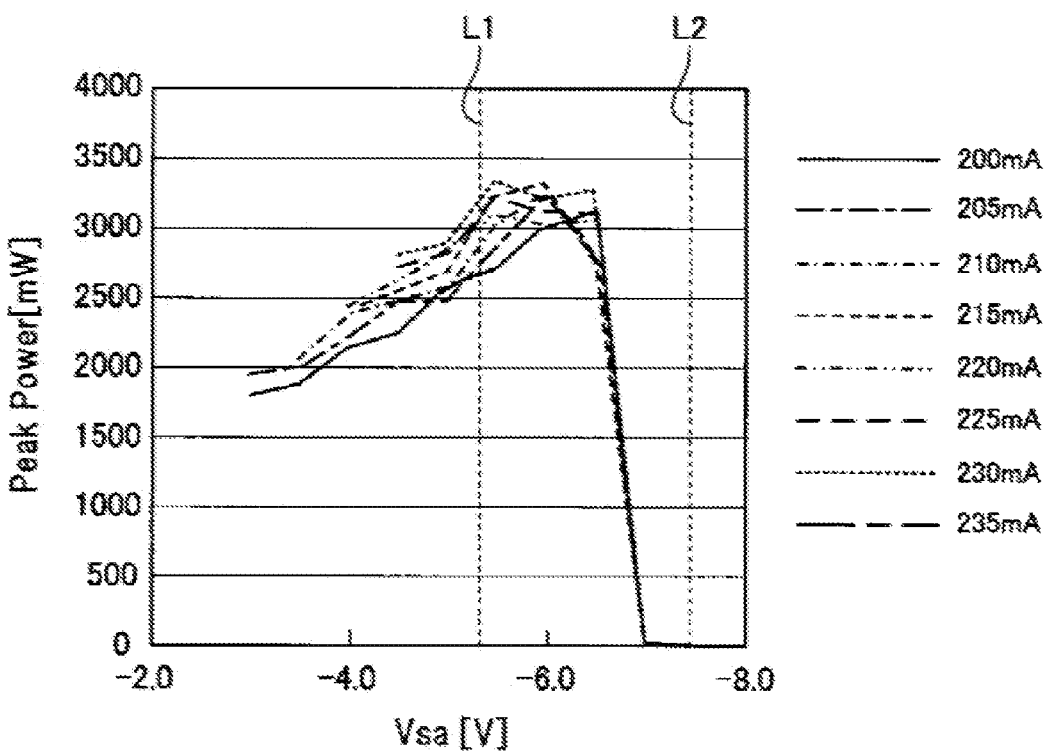
FIG. 5 is a diagram illustrating a relation between the reverse bias voltage applied to the self-excited oscillation semiconductor laser and the peak power of the oscillated light beam emitted from the self-excited oscillation semiconductor laser.

FIG. 5 is a diagram illustrating a relation between the reverse bias voltage (Vsa) applied to the self-excited oscillation semiconductor laser 1 and a peak power of the oscillated light beam emitted from the self-excited oscillation semiconductor laser 1 when the gain current (Igain) is at 200 mA or more. In FIG. 5 the horizontal axis represents the reverse bias voltage (Vsa) and the vertical axis represents the peak power. The change in the peak power at each current value is examined while changing the gain current at intervals of 5 mA from 200 mA to 235 mA.

As shown in FIG. 5, the oscillation of the self-excited oscillation semiconductor laser 1 stops when the reverse bias voltage (Vsa) increases in the negative direction from about −7 V in the range of the gain current (Igain). Accordingly, for example, the self-excited oscillation semiconductor laser 1 is in an ON (oscillation) state when the reverse bias voltage indicated by a line L1 of FIG. 5 is −5.5 V. The self-excited oscillation semiconductor laser 1 is in an OFF (non-oscillation) state when the reverse bias voltage indicated by a line L2 is −7.5 V. That is, for example, the ON (oscillation) state and the OFF (non-oscillation) state of the self-excited oscillation semiconductor laser 1 can be controlled by changing the reverse bias voltage to −5.5 V and −7.5 V.

Thus, the oscillated light beam emitted from the self-excited oscillation semiconductor laser 1 can be modulated by controlling the reverse bias voltage. Further, the frequency of the oscillated light beam emitted from the self-excited oscillation semiconductor laser 1 can be controlled by setting the reverse bias voltage as the period voltage with the maximum value of −7.5 V and the minimum value of −5 V.

Figure 6:
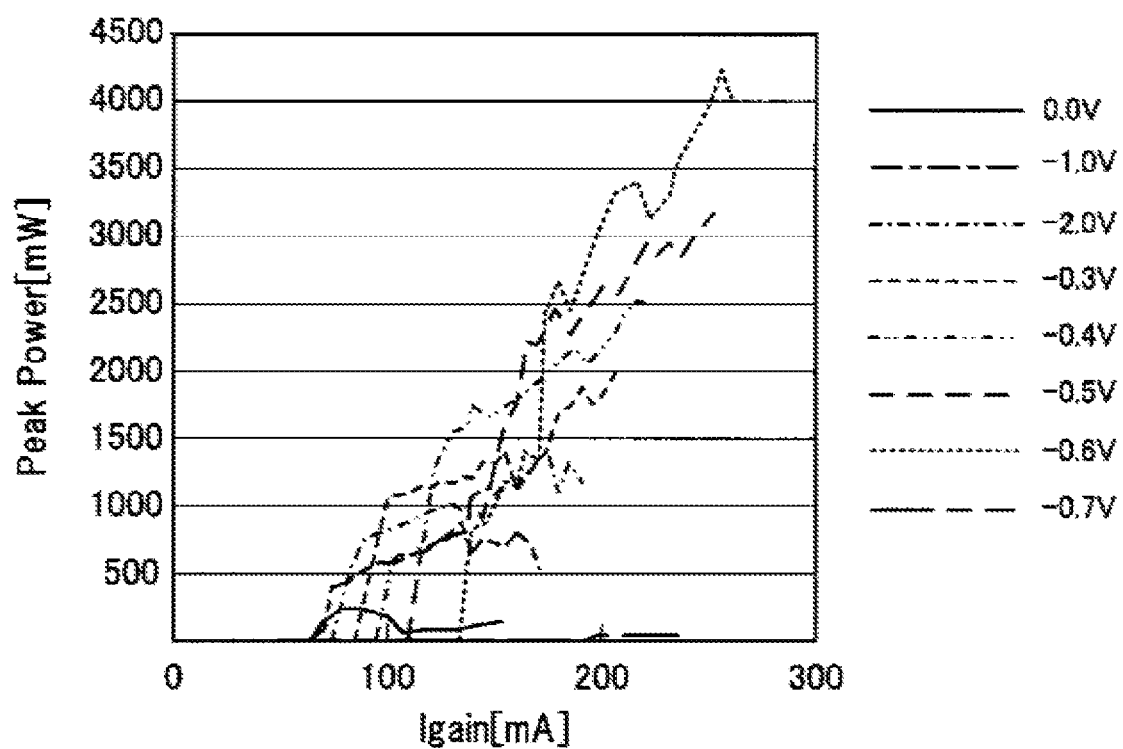
FIG. 6 is a diagram illustrating a relation between the gain current injected into the self-excited oscillation semiconductor laser and the peak power of the oscillated light beam emitted from the self-excited oscillation semiconductor laser.

FIG. 6 is a diagram illustrating a relation between the gain current (Igain) injected into the self-excited oscillation semiconductor laser 1 and the peak power of the oscillated light beam emitted from the self-excited oscillation semiconductor laser 1. In FIG. 6, the horizontal axis represents the gain current and the vertical axis represents the peak power.

As understood from FIG. 6, the greater the gain current (Igain) is, the greater the peak power of the oscillated light beam is. Accordingly, the peak power of the oscillated light beam from the self-excited oscillation semiconductor laser 1 can be controlled using the gain current (Igain).

The values of the peak power shown in FIGS. 4, 5, and 6 are calculated based on an average power monitored-value of the light output and the pulse width measured by a high-speed photo detector (40 GHz). Since only about 40 ps is detected with respect to the actual minimum pulse width of 15 ps because of the shortage of the bandwidth of the photo detector, a low peak value is displayed.

The above-described characteristics of the self-excited oscillation semiconductor laser 1 will be described below with reference to FIGS. 7A and 7B.

Figure 7:
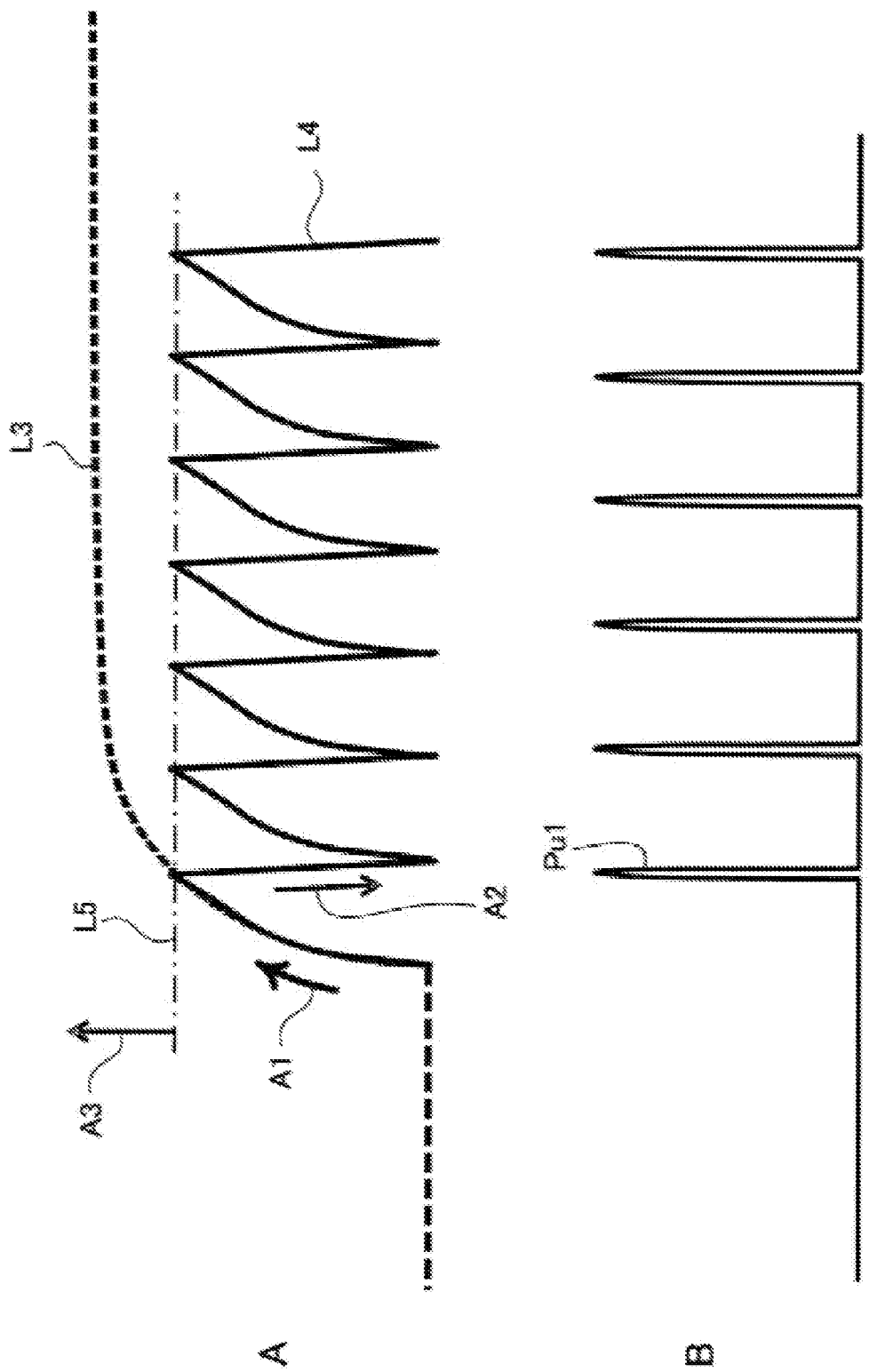
FIG. 7A is a diagram illustrating a relation among the gain current injected into the self-excited oscillation semiconductor laser, a charge density, and a light emission threshold value.
FIG. 7B is a diagram illustrating a waveform of pulsed light emitted from the self-excited oscillation semiconductor laser.

FIG. 7A is a diagram illustrating a relation between the gain current injected into the self-excited oscillation semiconductor laser 1 and the density of charge accumulated in the self-excited oscillation semiconductor laser 1 by the current injection. FIG. 7B is a diagram illustrating a waveform of light emitted from the self-excited oscillation semiconductor laser 1. Further, the reverse bias voltage is set to have a constant value.

In FIG. 7A, a characteristic L3 is a current value injected into the self-excited oscillation semiconductor laser 1 and a characteristic L4 is the density of the charge accumulated in the self-excited oscillation semiconductor laser 1 when the current is injected. Further, a characteristic L5 is a light emission threshold value determined as the reverse bias voltage Vsa.

As indicated by an arrow A1, the larger the gain current is, the higher the charge density of the charge accumulated in the self-excited oscillation semiconductor laser 1 is. When the charge density reaches the light emission threshold value indicated by the characteristic L5, pulsed light Pu1 shown in FIG. 7B is emitted. At this time, the charge is consumed when the pulsed light is emitted. Thus, the charge density in the self-excited oscillation semiconductor laser 1 is lowered, as indicated by an arrow A2.

Then, the charge is accumulated again in the self-excited oscillation semiconductor laser 1 by the gain current. When the charge density reaches the light emission threshold value indicated by the characteristic L5, the pulsed light is emitted. The self-excited oscillation semiconductor laser 1 performs continuous oscillation of the pulsed light by repeating this process.

The light emission threshold value for the charge density, which is indicated by the characteristic L5, is changed by the value of the reverse bias voltage applied to the self-excited oscillation semiconductor laser 1.

For example, when the reverse bias voltage increases in the negative direction, the light emission threshold value for the charge density, which is indicated by the characteristic L5, increases as indicated by an arrow A3. Therefore, since a time in which the charge density reaches the light emission threshold value is longer, the emission interval of the pulsed light is longer and the oscillation frequency of the self-excited oscillation semiconductor laser 1 thus decreases.

That is, according to this principle, the oscillation frequency of the self-excited oscillation semiconductor laser 1 can be controlled using the reverse bias voltage.

Further, when the light emission threshold value increases by increasing the reverse bias voltage in the negative direction, the charge density necessary for the oscillation of the laser light also increases. Therefore, since the amount of charge consumed in the oscillation increases, the energy of the emitted pulsed light also increases. Thus, the peak power of the oscillated light beam from the self-excited oscillation semiconductor laser 1 can be controlled using the reverse bias voltage.

On the other hand, the charge accumulated in the self-excited oscillation semiconductor laser 1 does not flow out (is not consumed) spontaneously from the self-excited oscillation semiconductor laser 1 in addition to the consumption of the pulsed light when the pulsed light is emitted. Therefore, there is a limit to the amount of charge (charge density) which can be accumulated in the self-excited oscillation semiconductor laser 1.

Therefore, when the value of the reverse bias voltage Vsa excessively increases in the negative direction, the light emission threshold value for the charge density which can be accumulated considerably increases. Thus, it is difficult to increase the charge density up to the light emission threshold value. For this reason, as shown in FIG. 4, when the reverse bias voltage Vsa increases up to a predetermined value in the negative direction, the self-excited oscillation semiconductor laser 1 does not oscillate.

In the reverse bias voltage Vsa, a threshold value at which the self-excited oscillation semiconductor laser 1 does not oscillate is present in the region of the negative value. Accordingly, to switch between the ON and OFF sates of the self-excited oscillation semiconductor laser 1, the reverse bias voltage in the OFF state is preferably set to a value greater than the threshold value in the negative direction. In other words, in the self-excited oscillation semiconductor laser 1 in which the reverse bias voltage is set to the value greater than the threshold value in the negative direction, the bias voltage during the non-oscillation period in which the oscillation of the laser light stops is greater than the reverse bias voltage in the negative direction during the oscillation period in which the laser light oscillates.

By setting the reverse bias voltage in this way, the ON and OFF states of the self-excited oscillation semiconductor laser 1 can be switched.

A principle of the modulation of the oscillated light beam emitted from the self-excited oscillation semiconductor laser 1 and the control of the oscillation frequency by the control of the reverse bias voltage will be described below with reference to FIGS. 8A to 8C.

Figure 8:
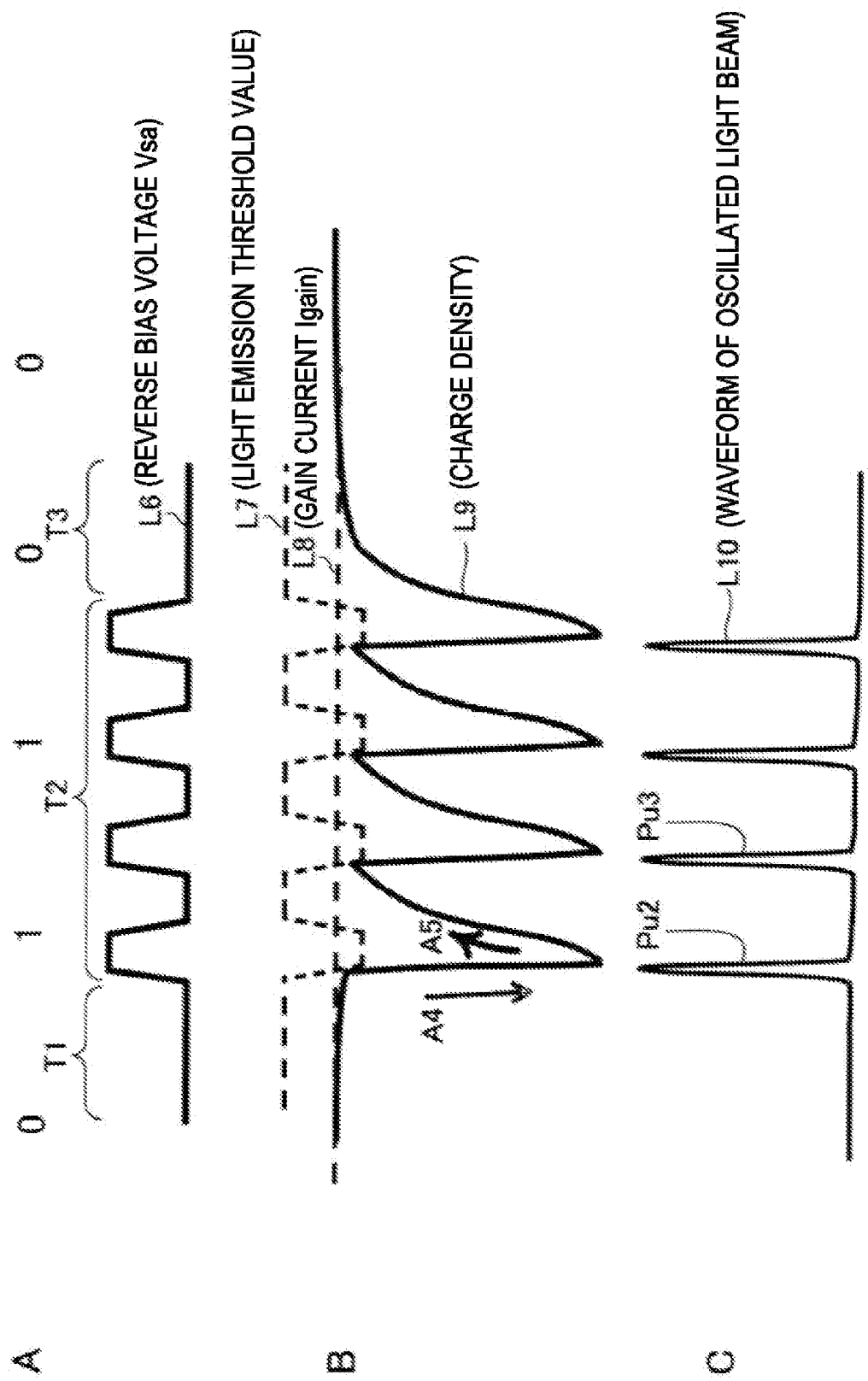
FIG. 8A is a diagram illustrating a binary signal.
FIG. 8B is a diagram illustrating a relation among the gain current injected into the self-excited oscillation semiconductor laser, a charge density, and a light emission threshold value.
FIG. 8C is a diagram illustrating a waveform of pulsed light emitted from the self-excited oscillation semiconductor laser.

As shown in FIG. 8A, for example, a case in which a binary signal is loaded on the oscillated light beam of the self-excited oscillation semiconductor laser 1 in the order of 0, 1, 1, 0, and 0 is considered. FIG. 8B is a diagram illustrating the reverse bias voltage (characteristic L6) applied in this case, a light emission threshold value (characteristic L7) corresponding to the reveres bias voltage, the waveform (characteristic L8) of the gain current injected into the self-excited oscillation semiconductor laser 1, and a charge density (characteristic L9) of the charge accumulated in the self-excited oscillation semiconductor laser 1. FIG. 8C is a diagram illustrating a waveform (characteristic L10) of the oscillated light beam emitted from the self-excited oscillation semiconductor laser 1 at this time.

As shown in FIG. 8C, it is assumed that two beams of the pulsed light emitted from the self-excited oscillation semiconductor laser 1 correspond to '1' of the binary signal. Further, the gain current is assumed to be constant during the entire period.

First, when '0' of the binary signal is expressed by the self-excited oscillation semiconductor laser 1, the value of the light emission threshold value is set so that the charge density indicated by the characteristic L9 does not exceed the light emission threshold value indicated by the characteristic L7 during a period T1 shown in FIG. 8B. Accordingly, the self-excited oscillation semiconductor laser 1 does not oscillate during the period T1 (non-oscillation period).

On the other hand, when '1' of the binary signal is expressed by the self-excited oscillation semiconductor laser 1, the reverse bias voltage indicated by the characteristic L6 is set as the period voltage that increases in the positive direction within the range of the negative value during the period T2 shown in FIG. 8B. Thus, the light emission threshold value indicated by the characteristic L7 decreases periodically during the period T2, and thus the charge density indicated by the characteristic L9 reaches the light emission threshold value. As a result, pulsed light Pu2 shown in FIG. 8C is emitted.

When the pulsed light Pu2 is emitted once and the charge is thus consumed, as indicated by an arrow A4 of FIG. 8B, the charge density is lowered. On the other hand, since the gain current indicated by the characteristic L8 is a direct current with a constant value during the period T1 (non-oscillation period) and during the period T2 (oscillation period), the charge can be accumulated again in the self-excited oscillation semiconductor laser 1. Therefore, as indicated by an arrow A5, the charge density increases. At this time, the reverse bias voltage indicated by the characteristic L6 in the period T2 is considered as the period voltage that increases periodically in the positive direction within the negative range. Therefore, the light emission threshold value indicated by the characteristic L7 is periodically changed also, and thus the light emission threshold value periodically decreases. When the charge density that increases again in the self-excited oscillation semiconductor laser 1 reaches the periodically changed light emission threshold value, the pulsed light Pu3 show in FIG. 8C is emitted.

Thus, when pulsed light Pu3 shown in FIG. 8C is emitted, '1' of the binary signal is expressed.

When '1' of the binary signal is changed to '0,' the reverse bias voltage indicated by the characteristic L6 increases in the negative direction, as shown in a period T3 (non-oscillation period) of FIG. 8B. Thus, during the period T3, the light emission threshold value indicated by the characteristic L7 increases and the charge density indicated by the characteristic L9 does not reach the light emission threshold value. Accordingly, the self-excited oscillation semiconductor laser 1 does not oscillate and enters a stop state, and '0' of the binary signal is expressed.

Thus, the light emission threshold value is periodically changed by setting the reverse bias voltage as the periodically changed period voltage during the period T2 which is the oscillation period, and the pulsed light can be emitted in accordance with the periodically changed threshold value. That is, since the pulsed light can be emitted in accordance with the period of the reverse bias voltage, the oscillation frequency can be controlled at the period of the reverse bias voltage and the number of pulsed beams emitted at the period of the reverse bias voltage can be controlled.

Figure 9:
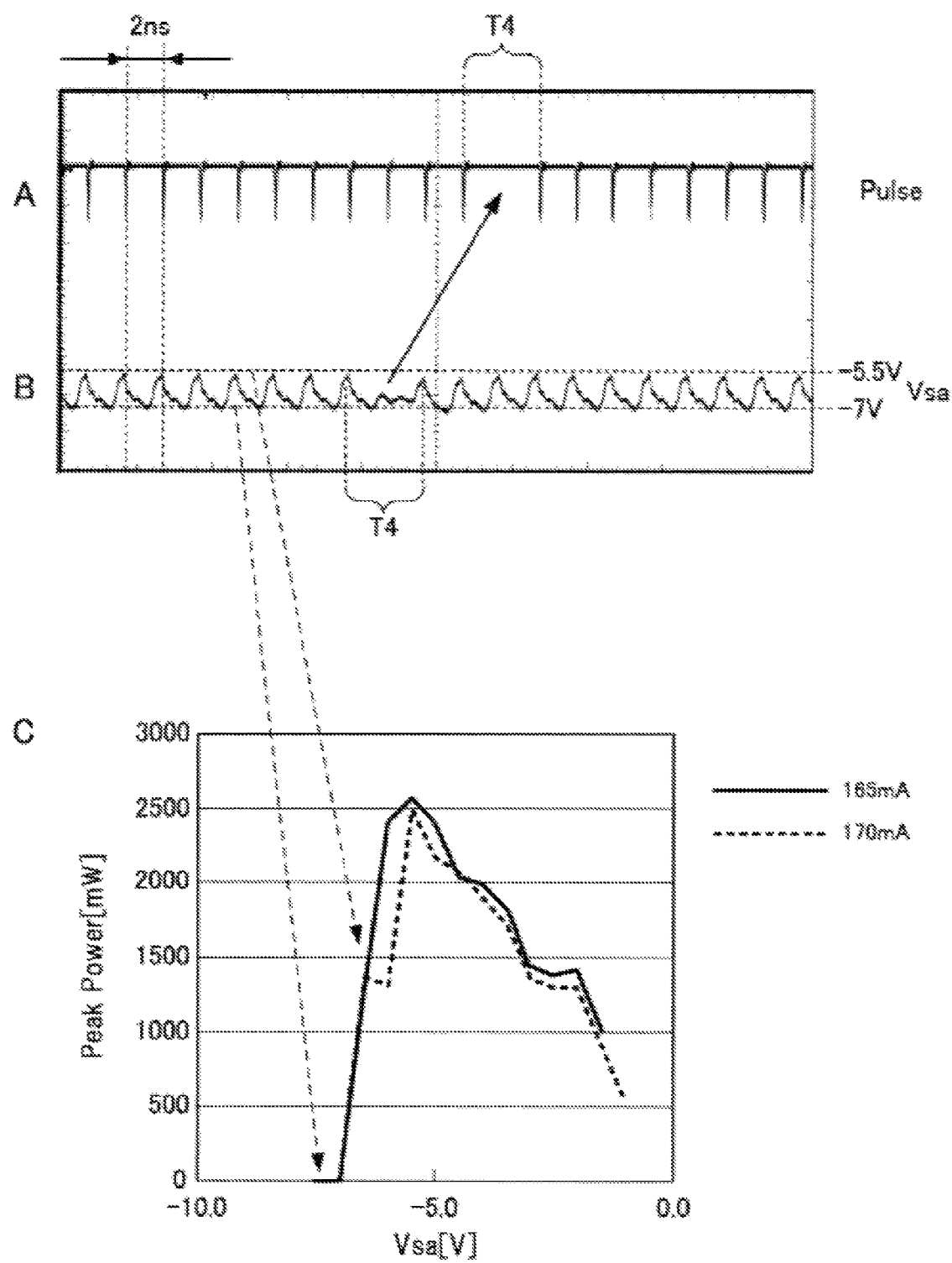
FIG. 9A is a diagram illustrating a waveform of an oscillated light beam emitted from the self-excited oscillation semiconductor laser.
FIG. 9B is a diagram illustrating a reverse bias voltage applied to the self-excited oscillation semiconductor laser.
FIG. 9C is a diagram illustrating an output power with respect to the reverse bias voltage when the gain current is constant.

FIGS. 9A to 9C show the result of a confirmation experiment of the change operation shown in FIGS. 8A to 8C. FIG. 9A is a diagram illustrating the waveform of the oscillated light beam emitted from the self-excited oscillation semiconductor laser 1. FIG. 9B is a diagram illustrating the reverse bias voltage applied to the self-excited oscillation semiconductor laser 1. FIG. 9C is a diagram illustrating an output power with respect to the reverse bias voltage when the gain current is constant as 165 mA or 170 mA.

In the confirmation experiment, the reverse bias voltage is set as a period voltage that is periodically changed from −5.5 V to −7 V at a period of 2 nsec. Further, the gain current is set to have a constant current value of 170 mA. In FIG. 9B, the waveform of the reverse bias voltage set as the period voltage is not a rectangular pulse, but is produced by reflection or the like of a signal. In effect, a rectangular pulse is applied. In FIG. 9B, a period T4 in which the reverse bias voltage is almost constant as −7 V corresponds to a period T4 in which the pulsed light shown in FIG. 9A is not oscillated. A deviation between the time axes of FIGS. 9A and 9B is caused by a delay occurring due to a detector. The deviation is caused by a time necessary for converting and outputting the pulsed light after detection of the pulsed light, In effect, the period T4 shown in FIG. 9A and the period T4 shown in FIG. 9B are substantially the same time. The pulsed light shown in FIG. 9A is oscillated at a time at which the reverse bias voltage is −5.5 V.

As understood from FIGS. 9A and 9B, the self-excited oscillation semiconductor laser 1 does not oscillate the pulsed light during a period in which the reverse bias voltage is −7 V. When the reverse bias voltage is −5.5 V, the self-excited oscillation semiconductor laser 1 oscillates the pulsed light almost concurrently. From FIG. 9C, it can be understood that the peak power of the pulsed light is about 5 W when the gain current is 170 mA and the reverse bias voltage is −5.5 V. Further, the pulsed light is not oscillated during the period T4 in which the reverse bias voltage is constant as −7 V. From FIG. 9C, it can be understood that the peak power of the pulsed light is almost zero when the revere basis voltage is −7 V.

Thus, it can be understood that the pulsed light can be modulated using the reverse bias voltage in the self-excited oscillation semiconductor laser 1, and the pulsed light can be forcibly oscillated by setting the reverse bias voltage as the period voltage changed between −5.5 V and −7 V during the oscillation period. Further, the oscillation frequency and the number of pulsed light to be oscillated during the oscillation period can be understood to be controlled by the period of the period voltage.

Here, when the period of the reverse bias voltage is shorter than a time in which the charge density reaches the light emission threshold value after the oscillation of the pulsed light, the accumulation of the charge may not be sufficient and the pulsed light may thus not be emitted in one period of the reverse bias voltage during the oscillation period. Therefore, to generate the pulsed light at the period of the reverse bias voltage, as shown in FIG. 9A, the period of the reverse bias voltage during the oscillation period should be set to be longer than the time in which the charge density reaches the light emission threshold value.

Accordingly, to forcibly generate one-round pulse light in the time corresponding to one period of the reverse bias voltage during the oscillation period, the period of the reverse bias voltage is preferably set to be longer than the time in which the charge density reaches the light emission threshold value. Alternatively, the one-round pulsed light can be adjusted such that the pulsed light is forcibly emitted every period of the reverse bias voltage by setting the light emission threshold value to be smaller or adjusting the value of the gain current such that the time in which the charge density reaches the light emission threshold value is advanced. The period of the reverse bias voltage or the adjustment of the increase characteristics of the charge density is preferably determined to be optimum in consideration of a relation between the oscillation frequency and the output power.

The larger the value of the gain current is, the shorter the time in which the charge density reaches the light emission threshold value is. Then, as shown in FIG. 7A, when the threshold value voltage is constant, the emission interval of the pulsed light decreases and the oscillation frequency of the self-excited oscillation semiconductor laser 1 thus increases.

According to this principle, the interval of the pulsed light oscillated during the oscillation period can be adjusted in the self-excited oscillation semiconductor laser 1 having the characteristics shown in FIGS. 8A to 8C.

Figure 10:
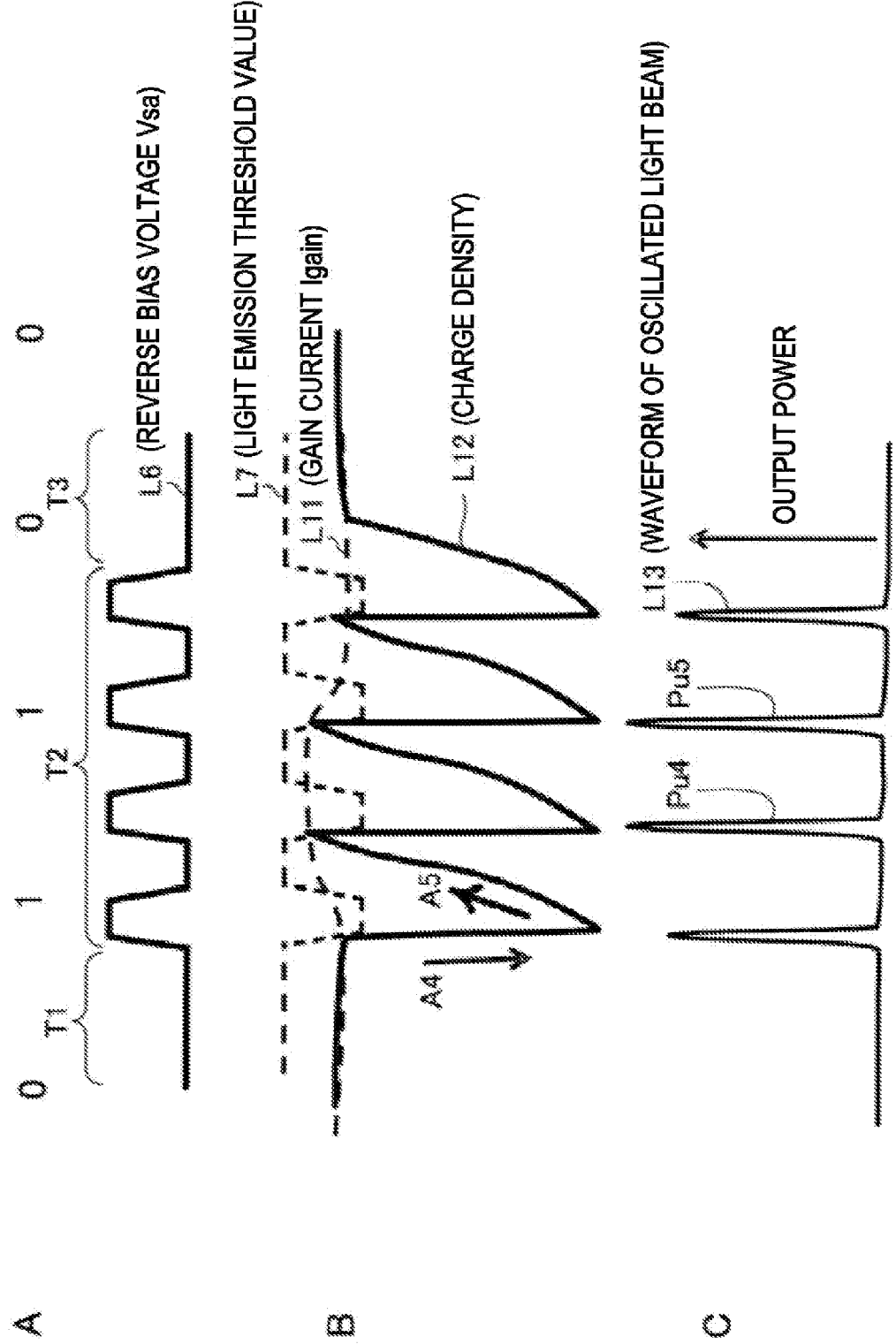
FIG. 10A is a diagram illustrating a binary signal.
FIG. 10B is a diagram illustrating a relation among the gain current injected into the self-excited oscillation semiconductor laser, a charge density, and a light emission threshold value.
FIG. 10C is a diagram illustrating a waveform of pulsed light emitted from the self-excited oscillation semiconductor laser.

The principle in which the interval of the pulsed light oscillated during the oscillation period is adjusted in the self-excited oscillation semiconductor laser 1 that sets the reverse bias voltage as the periodically changed period voltage and oscillates the pulsed light at the period of the period voltage will be described below with reference to FIGS. 10A to 10C. In FIGS. 10A to 10C, the same reference numerals are given to portions corresponding to those in FIGS. 8A to 8C, and the description thereof will not be repeated.

As shown in FIG. 10A, for example, a binary signal is considered in which 0, 1, 1, 0, and 0 are sequentially set in the oscillated light beam of the self-excited oscillation semiconductor laser 1. FIG. 10B is a diagram illustrating a reverse bias voltage (characteristic L6) applied in this time, a light emission threshold value (characteristic L7) corresponding to the reverse bias voltage, the waveform (characteristic L11) of the gain current injected into the self-excited oscillation semiconductor laser 1, and a charge density (characteristic L12) of the charge accumulated in the self-excited oscillation semiconductor laser 1. FIG. 10C is a diagram illustrating a waveform (characteristic L13) of the oscillated light beam emitted from the self-excited oscillation semiconductor laser 1 at this time.

As shown in FIG. 10C, it is assumed that two beams of the pulsed light emitted from the self-excited oscillation semiconductor laser 1 correspond to '1' of the binary signal.

Here, to adjust the interval of the pulsed light shown in FIG. 10C, that is, the amplitude of the pulsed light, the characteristic L11 of the gain current is assumed to have a profile in which the value of the gain current increases only during a given period. During the period in which the value of the gain current increases, the amount of charge accumulated until the charge density reaches the light emission threshold value again after the oscillation of the pulsed light increases.

Compared to FIG. 8B, for example, in FIG. 10B, the value of the gain current increases during the emission periods of the second pulsed light Pu4 and the third pulsed light Pu5. Accordingly, the amplitudes of the second pulsed light Pu4 and the third pulsed light Pu5 increase. Thus, the amplitude of each pulsed light oscillated within the oscillation period can be minutely adjusted by changing the value of the gain current within the oscillation period.

When the reverse bias voltage is set as the period voltage during the oscillation period of the pulsed light and the pulsed light is oscillated in synchronization with the period voltage, the amplitude of the pulsed light within the oscillation period can be minutely adjusted by controlling the profile of the gain current. Accordingly, it is possible to minutely adjust the amplitude of the pulsed light designed for a recording compensation process in accordance with a recording medium.

2. Configuration of Recording Apparatus

A recording apparatus including the self-excited oscillation semiconductor laser 1 having the above-described characteristics will be described below.

Figure 11:
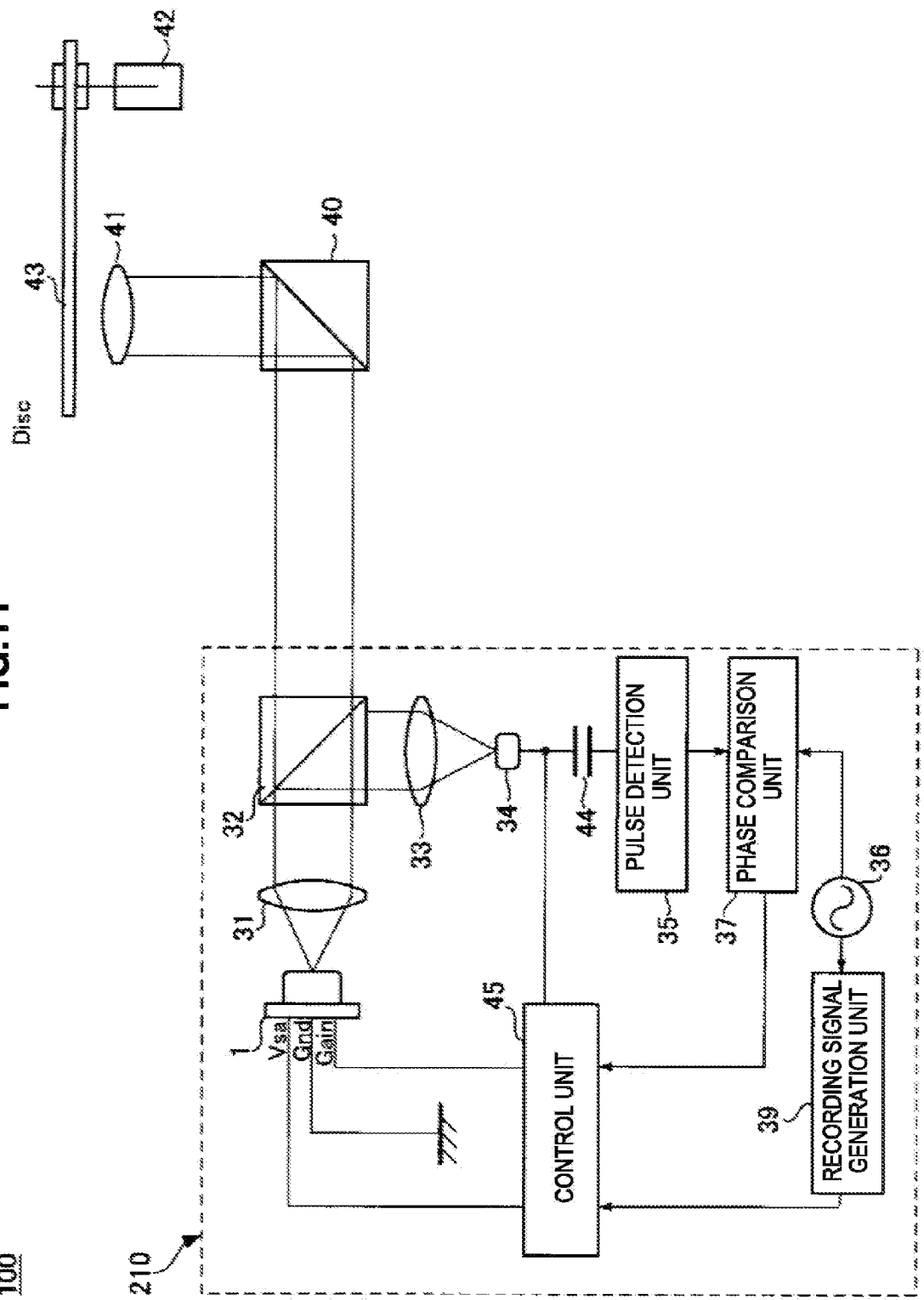
FIG. 11 is a schematic diagram illustrating the configuration of a recording apparatus according to an embodiment of the present application.

FIG. 11 is a schematic diagram illustrating the configuration of a recording apparatus 100 according to an embodiment of the present application. The recording apparatus 100 according to this embodiment includes an optical oscillation unit 210, which is an optical oscillation device, and an objective lens 41 that condenses an oscillated light beam emitted from the optical oscillation unit 210 on an optical recording medium 43.

The optical oscillation unit 210 includes the above-described self-excited oscillation semiconductor laser 1 serving as a light source, a collimator lens 31 that collimates the light from the self-excited oscillation semiconductor laser 1, and an optical separation unit 32 that separates the light having passed through the collimator lens 31 into beams.

The optical oscillation unit 210 further includes a collecting lens 33 that collects one beam of the light separated by the optical separation unit 32 and a light reception element 34 that receives the light collected by the collecting lens 33.

The optical oscillation unit 210 further includes a pulse detection unit 35 that detects the light received by the light reception element 34 and a reference signal generation unit 36 that generates a master clock signal. The optical oscillation unit 210 further includes a phase comparison unit 37 that compares the phase of the light detected by the pulse detection unit 35 with the phase of the master clock signal.

The optical oscillation unit 210 according to this embodiment further includes a control unit 45 that controls the reverse bias voltage to be applied to the self-excited oscillation semiconductor laser 1 and the gain current to be injected into the self-excited oscillation semiconductor laser 1.

The optical oscillation unit 210 according to this embodiment further includes a recording signal generation unit 39 that generates a recording signal at a timing of the master clock signal.

First, the recording signal generation unit 39 generates a recording signal (binary signal) to be recorded in an optical recording medium such as an optical disc at the timing of the master clock signal generated by the reference signal generation unit 36.

The control unit 45 controls the reverse bias voltage to be applied to the self-excited oscillation semiconductor laser 1 based on the recording signal generated by the recording signal generation unit 39. In this case, as described above, the reverse bias voltage during the non-oscillation period ('0' of the binary signal) of the self-excited oscillation semiconductor laser 1 is held as a constant negative value. Further, the reverse bias voltage during the oscillation period ('1' of the binary signal) is set as the period voltage that periodically increases in the positive direction from the value of the reverse bias voltage of the non-oscillation period within the negative range. Thus, during the oscillation period, the pulsed light at the period of the reverse bias voltage is emitted from the self-excited oscillation semiconductor laser 1. Accordingly, the period of the reverse bias voltage during the oscillation period can be controlled in accordance with the recording signal, and the oscillated light beam emitted from the self-excited oscillation semiconductor laser 1 can be modified in accordance with the recording signal (see FIGS. 8A to 8C).

The oscillated light beam from the self-excited oscillation semiconductor laser 1 modulated in accordance with the recording signal is collimated by the collimator lens 31, and then is incident on the optical separation unit 32.

The optical separation unit 32, which is configured by, for example, a beam splitter, separates the light emitted from the self-excited oscillation semiconductor laser 1 into two light fluxes. Of the two separated light fluxes, for example, the light flux reflected from the optical separation unit 32 is collected on the light reception element 34 by the collecting lens 33. For example, a photodiode is used in the light reception element 34.

The pulse detection unit 35 is connected to the light reception element 34 via a capacitor 44 and detects the pulse of the light received by the light reception element 34.

The phase comparison unit 37 compares the phase of the master clock signal generated by the reference signal generation unit 36 with the phase of the pulse detected by the pulse detection unit 35 to calculate a phase difference between the phase of the master clock signal and the phase of the pulse. The control unit 45 controls the profile of the gain current to be injected into the self-excited oscillation semiconductor laser 1 based on the phase difference calculated by the phase comparison unit 37 and adjusts the frequency of the pulsed light oscillated from the self-excited oscillation semiconductor laser 1 for each pulsed light. Thus, the control unit 45 minutely adjusts the interval of the pulsed light during the oscillation period (FIGS. 10A to 10C).

On the other hand, the oscillated light beam which has been emitted from the self-excited oscillation semiconductor laser 1 and has passed through the optical separation unit 32 is incident on the mirror 40. Then, the oscillated light beam is reflected from the mirror 40, the optical path of the oscillated light beam is thus changed, and then the oscillated light beam is incident on the objective lens 41.

The oscillated light beam incident on the objective lens 41 is collected on the optical recording medium 43. The optical recording medium 43 is rotated in the in-plane direction of an optical recording surface by a spindle motor 42. A collection spot of the laser light is frequently moved in a radial direction of the optical recording medium 43 by a thread motor (not shown) or the like. Accordingly, the oscillated light beam from the self-excited oscillation semiconductor laser 1 is emitted to the optical recording surface of the optical recording medium 43 in a spiral shape or a concentric shape, and thus recording information loaded on the oscillated light beam is sequentially recorded on the optical recording medium 43.

Thus, in the recording apparatus 100 according to this embodiment, the oscillated light beam emitted from the self-excited oscillation semiconductor laser 1 is modulated using the reverse bias voltage to be applied to the self-excited oscillation semiconductor laser 1 and the frequency of the oscillated light beam can be appropriately set at the period of the reverse bias voltage. Since the reverse bias voltage is applied to the self-excited oscillation semiconductor laser 1 in accordance with the recording signal, the recording information can be loaded on the oscillated light beam emitted from the self-excited oscillation semiconductor laser 1.

In the recording apparatus 100 according this embodiment, the minute adjustment of the pulse interval of the oscillated light beam can be controlled using the gain current to be injected into the self-excited oscillation semiconductor laser 1. Accordingly, information can be recorded on an optical recording medium with good accuracy.

The signal loaded on the oscillated light beam from the self-excited oscillation semiconductor laser 1 is not limited to the recording signal, but may be any signal. That is, by providing a signal generation unit generating any given signal instead of the recording signal generation unit 39, the optical oscillation unit 210 can be configured as an optical oscillation device that emits the oscillated light beam on which the any given signal is loaded.

Here, the tri-sectional type self-excited oscillation semiconductor laser including two gain sections has been used as the self-excited oscillation semiconductor laser 1. However, the same operations and advantages can be obtained even when a bi-sectional type self-excited oscillation semiconductor laser including one gain section is used.

The optical oscillation device and the recording apparatus according to the embodiments of the present application have been described above. The present application is not limited to the above-described embodiments, but may, of course, include various embodiments without departing from the technical spirit and essence within the scope of the claims.

The present application may also be configured as below.

(1) A recording apparatus comprising:
  a self-excited oscillation semiconductor laser that has a double quantum well separate confinement heterostructure and includes a saturable absorber section to which a negative bias voltage is applied and a gain section into which a gain current is injected;
  an optical separation unit that separates an oscillated light beam from the self-excited oscillation semiconductor laser into two oscillated light beams;
  an objective lens that condenses one of the separated oscillated light beams on an optical recording medium;
  a light reception element that receives the one of the oscillated light beams separated by the optical separation unit;
  a pulse detection unit that detects a pulse of the oscillated light beam received by the light reception element;
  a reference signal generation unit that generates a master clock signal;
  a phase comparison unit that calculates a phase difference between the master clock signal and the pulse;
  a recording signal generation unit that generates a recording signal using a negative voltage at a timing of the master clock signal; and
  a control unit that controls the negative bias voltage to be applied to the saturable absorber section based on the recording signal and that outputs a direct current voltage during a non-oscillation period of the self-excited oscillation semiconductor laser and outputs a period voltage changed at a desired period during an oscillation period of the self-excited oscillation semiconductor laser.

(2) The recording apparatus according to (1), wherein the control unit controls the gain current to be injected into the gain section of the self-excited oscillation semiconductor laser based on the phase difference and adjusts an interval of the pulse during the oscillation period.

(3) The recording apparatus according to (1) or (2),
  wherein the self-excited oscillation semiconductor laser includes an active layer, a GaInN guide layer, a p-type AlGaN barrier layer, a p-type GaN/AlGaN superlattice first-clad layer, and a p-type GaN/AlGaN superlattice second-clad layer, and
  the GaInN guide layer, the p-type AlGaN barrier layer, the p-type GaN/AlGaN superlattice first-clad layer, and the p-type GaN/AlGaN superlattice second-clad layer are sequentially laminated on one surface of the active layer.

(4) The recording apparatus according to any one of (1) to (3), wherein the self-excited oscillation semiconductor laser includes an n-type GaN guide layer, an n-type AlGaN clad layer, and an n-type GaN layer that are sequentially formed on the other surface of the active layer.

(5) An optical oscillation device comprising:
- a self-excited oscillation semiconductor laser that has a double quantum well separate confinement heterostructure and includes a saturable absorber section to which a negative bias voltage is applied and a gain section into which a gain current is injected;
- an optical separation unit that separates an oscillated light beam from the self-excited oscillation semiconductor laser;
- a light reception element that receives one of the oscillated light beams separated by the optical separation unit;
- a pulse detection unit that detects a pulse of the oscillated light beam received by the light reception element;
- a reference signal generation unit that generates a master clock signal;
- a phase comparison unit that calculates a phase difference between the master clock signal and the pulse;
- a signal generation unit that generates a predetermined signal using a negative voltage at a timing of the master clock signal; and
- a control unit that controls the negative bias voltage to be applied to the saturable absorber section based on the signal and that outputs a direct current voltage during a non-oscillation period of the self-excited oscillation semiconductor laser and outputs a period voltage changed at a desired period during an oscillation period of the self-excited oscillation semiconductor laser.

(6) The optical oscillation device according to (5), wherein the control unit controls the gain current to be injected into the gain section of the self-excited oscillation semiconductor laser based on the phase difference and adjusts an amplitude of the pulse within the oscillation period.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A recording apparatus comprising:
- a self-excited oscillation semiconductor laser that has a double quantum well separate confinement heterostructure and includes a saturable absorber section to which a negative bias voltage is applied and a gain section into which a gain current is injected;
- an optical separation unit that separates an oscillated light beam from the self-excited oscillation semiconductor laser into two oscillated light beams;
- an objective lens that condenses one of the separated oscillated light beams on an optical recording medium;
- a light reception element that receives the one of the oscillated light beams separated by the optical separation unit;
- a pulse detection unit that detects a pulse of the oscillated light beam received by the light reception element;
- a reference signal generation unit that generates a master clock signal;
- a phase comparison unit that calculates a phase difference between the master clock signal and the pulse;
- a recording signal generation unit that generates a recording signal using a negative voltage at a timing of the master clock signal; and
- a control unit that controls the negative bias voltage to be applied to the saturable absorber section based on the recording signal and that outputs a direct current voltage during a non-oscillation period of the self-excited oscillation semiconductor laser and outputs a period voltage changed at a desired period during an oscillation period of the self-excited oscillation semiconductor laser;
- wherein the control unit controls the gain current to be injected into the gain section of the self-excited oscillation semiconductor laser based on the phase difference and adjusts an interval of the pulse during the oscillation period.

2. The recording apparatus according to claim 1, wherein the self-excited oscillation semiconductor laser includes an active layer, a GaInN guide layer, a p-type AlGaN barrier layer, a p-type GaN/AlGaN superlattice first-clad layer, and a p-type GaN/AlGaN superlattice second-clad layer, and the GaInN guide layer, the p-type AlGaN barrier layer, the p-type GaN/AlGaN superlattice first-clad layer, and the p-type GaN/AlGaN superlattice second-clad layer are sequentially laminated on one surface of the active layer.

3. The recording apparatus according to claim 2, wherein the self-excited oscillation semiconductor laser includes an n-type GaN guide layer, an n-type AlGaN clad layer, and an n-type GaN layer that are sequentially formed on the other surface of the active layer.

4. An optical oscillation device comprising:
- a self-excited oscillation semiconductor laser that has a double quantum well separate confinement heterostructure and includes a saturable absorber section to which a negative bias voltage is applied and a gain section into which a gain current is injected;
- an optical separation unit that separates an oscillated light beam from the self-excited oscillation semiconductor laser;
- a light reception element that receives one of the oscillated light beams separated by the optical separation unit;
- a pulse detection unit that detects a pulse of the oscillated light beam received by the light reception element;
- a reference signal generation unit that generates a master clock signal;
- a phase comparison unit that calculates a phase difference between the master clock signal and the pulse;
- a signal generation unit that generates a predetermined signal using a negative voltage at a timing of the master clock signal; and
- a control unit that controls the negative bias voltage to be applied to the saturable absorber section based on the signal and that outputs a direct current voltage during a non-oscillation period of the self-excited oscillation semiconductor laser and outputs a period voltage changed at a desired period during an oscillation period of the self-excited oscillation semiconductor laser; and
- wherein the control unit controls the gain current to be injected into the gain section of the self-excited oscillation semiconductor laser based on the phase difference and adjusts an amplitude of the pulse within the oscillation period.

* * * * *